United States Patent
Goetz et al.

(10) Patent No.: US 8,623,254 B2
(45) Date of Patent: Jan. 7, 2014

(54) METHOD AND DEVICE FOR PRODUCING A MAGNETIC FIELD SENSOR

(75) Inventors: Rolf Goetz, Friedrichroda (DE); Steffen Schulze, Eisenach (DE); Daniel Matthie, Eisenach (DE); Markus Kny, Wasungen (DE); Frank Weishaeutel, Wangenheim (DE)

(73) Assignee: Robert Bosch GmbH, Stuttgart (DE)

( * ) Notice: Subject to any disclaimer, the term of this patent is extended or adjusted under 35 U.S.C. 154(b) by 254 days.

(21) Appl. No.: 12/676,973

(22) PCT Filed: Nov. 26, 2008

(86) PCT No.: PCT/EP2008/066224
§ 371 (c)(1),
(2), (4) Date: Mar. 8, 2010

(87) PCT Pub. No.: WO2009/092478
PCT Pub. Date: Jul. 30, 2009

(65) Prior Publication Data
US 2010/0207295 A1     Aug. 19, 2010

(30) Foreign Application Priority Data
Jan. 21, 2008 (DE) .......................... 10 2008 005 315

(51) Int. Cl.
*B29C 45/14*        (2006.01)

(52) U.S. Cl.
USPC ............. 264/272.11; 264/271.1; 264/272.12; 264/272.13; 264/272.14; 264/272.15; 264/272.16; 264/272.17; 264/272.18; 264/272.19; 264/272.2; 264/272.21; 264/273; 264/274; 264/275; 264/276; 264/277; 264/278; 264/279; 264/279.1; 264/294; 264/297.1; 264/297.2; 264/328.1; 264/328.8; 264/240; 264/241; 264/242; 264/250; 264/255; 264/260; 264/261; 264/262; 264/263

(58) Field of Classification Search
USPC .............. 264/272.11, 478, 645, 297.2, 271.1, 264/272.2, 272.21, 272.12–272.19, 264/273–279, 279.1, 294, 297.1, 328.1, 264/328.8, 240, 241, 242, 250, 255, 260, 264/261, 262, 263
See application file for complete search history.

(56) References Cited

U.S. PATENT DOCUMENTS

| | | | |
|---|---|---|---|
| 5,032,790 A | | 7/1991 | Johnson |
| 5,631,557 A | * | 5/1997 | Davidson ...................... 324/174 |

(Continued)

FOREIGN PATENT DOCUMENTS

| | | |
|---|---|---|
| DE | 42 28 888 | 3/1994 |
| DE | 101 29 222 | 1/2003 |
| DE | 10 2004 010 904 | 9/2005 |
| DE | 10 2004 018 869 | 11/2005 |

(Continued)

*Primary Examiner* — Jeffrey Wollschlager
*Assistant Examiner* — Stella Yi
(74) *Attorney, Agent, or Firm* — Michael J. Striker

(57) ABSTRACT

A method for producing a magnetic field sensor for use in drive train of a motor vehicle includes encapsulating an electrical assembly and an end of a connecting cable via injection molding and integrally extruding a fastening tab. After a first injection step in which the electrical assembly and the connecting cable are encapsulated in a core-type first molded part, a second injection molding step in implemented in which a fastening tab is integrally formed via injection molding on the core-type insertion part in a specifiable longitudinal and/or angular position. The core-like insertion part is held in the injection mold in a longitudinally displaceable and/or rotatable manner.

7 Claims, 6 Drawing Sheets

(56) References Cited

U.S. PATENT DOCUMENTS

| | | | |
|---|---|---|---|
| 6,131,267 A * | 10/2000 | Van Den Berg | 29/595 |
| 6,636,034 B2 | 10/2003 | Skarpil et al. | |
| 7,463,019 B2 | 12/2008 | Kaltenbach et al. | |
| 2003/0011365 A1 | 1/2003 | Skarpil et al. | |
| 2006/0066008 A1 | 3/2006 | Skarpil | |
| 2007/0164244 A1 | 7/2007 | Kratzer | |
| 2007/0296398 A1 | 12/2007 | Kaltenbach et al. | |
| 2009/0140725 A1 * | 6/2009 | Ausserlechner | 324/207.2 |

FOREIGN PATENT DOCUMENTS

| | | |
|---|---|---|
| DE | 10 2006 050 177 | 4/2008 |
| EP | 0 694 766 | 1/1996 |
| EP | 1 810 902 | 7/2007 |
| FR | 2576245 | 7/1986 |
| FR | 2 864 700 | 7/2005 |
| JP | 8-122347 | 5/1996 |
| WO | 2007/033856 | 3/2007 |
| WO | 2008/058803 | 5/2008 |

* cited by examiner

METHOD AND DEVICE FOR PRODUCING A MAGNETIC FIELD SENSOR

CROSS-REFERENCE TO RELATED APPLICATION

The invention described and claimed hereinbelow is also described in German Patent Application DE 10 2008 005 315.5 filed on Jan. 21, 2008. This German Patent Application, whose subject matter is incorporated here by reference, provides the basis for a claim of priority of invention under 35 U.S.C. 119(a)-(d).

BACKGROUND OF THE INVENTION

The present invention is directed to a method and a device for producing a magnetic field sensor according to the preamble of the independent claims. A magnetic field sensor that is produced using the proposed method and/or using the claimed device is likewise the subject matter of the present invention.

DE 101 29 222 A1 made known a magnetic field sensor and a method for its manufacture by encapsulating, via injection molding, a carrier that contains a sensor element. The sensor element is situated on a carrier element which is composed of metal, and it is fixed in a defined position relative to a rotating sensor element by encapsulating it in plastic via injection molding. The position of the sensor element is established by a stop that defines the distance between the sensor and the encoder; neither this distance nor the angular position of the sensor relative to the encoder are changeable.

Furthermore, DE patent application 10 2006 050 177.2 has already proposed a magnetic field sensor that is designed as a rotational speed sensor and/or a direction of rotation sensor for a motor vehicle, in which a sensor element that is sensitive to a magnetic field, and its carrier, are encapsulated in plastic via injection molding. The plastic injection-molded coating also encapsulates the end of a connecting cable, and is designed such that the injection-molded part forms a connecting tab having a fastening socket in which a sensor is installed. As a result, it is possible to adjust the angular position of the sensor, within narrow limits, relative to a sensor ring by rotating it about the central axis of the fastening socket, without changing the axial positioning of the sensor.

SUMMARY OF THE INVENTION

In contrast, a sensor which is manufactured according to the proposed method and/or using the device according to the present invention has the advantage that, in accordance with the particular installation conditions of the sensor, the longitudinal position and the angular position of the fastening tab, and therefore, the position of the sensor relative to a transmitter element are changeable, thereby making it possible to manufacture sensors for different installation situations without changing tool inserts or even the entire injection mold.

It is particularly advantageous if a core-type insertion part, which has been produced in a first injection step, is held, in a second injection step, in a tool insert which is longitudinally displaceable and/or rotatable in the injection mold. In this manner, the insertion part may be positioned exactly and easily before the second injection step, and the fastening tab may be integrally formed thereon, via injection molding, in the specified longitudinal and angular position. Advantageously, the core-type insertion part is substantially cylindrical in shape, and is positioned in a bore, thereby further simplifying the insertion and orientation of the insertion part that includes the electrical assembly.

In terms of the design of the device, according to the present invention, for manufacturing a magnetic field sensor that includes a fastening tab that determines the installation position of the sensor, it is particularly advantageous when, in order to integrally extrude the fastening tab, a tool insert is situated in an injection mold such that it is longitudinally displaceable and/or rotatable, in order to accommodate a core-type insertion part which was manufactured in a previous working step and contains the electrical assembly. It is thereby possible to manufacture sensors, which are based on the same basic design, for use in different installation conditions having different longitudinal and angular positions relative to a transmitter element without the need to make expensive changes to the injection mold.

Advantageously, the tool insert is continually displaceable in the injection mold, and it may be locked in different longitudinal and/or angular positions. The tool insert and the core-type insertion part which includes the electrical assembly are preferably designed cylindrical or hollow-cylindrical in shape, thereby simplifying installation and positioning.

Further details and advantageous embodiments of the present invention result from the dependent claims and the description of an embodiment.

BRIEF DESCRIPTION OF THE DRAWINGS

Embodiments of a magnetic field sensor which was produced according to the present invention, and a device for its manufacture, are presented in the drawings and are described in greater detail in the description that follows.

DETAILED DESCRIPTION OF THE INVENTION

Figure 1:
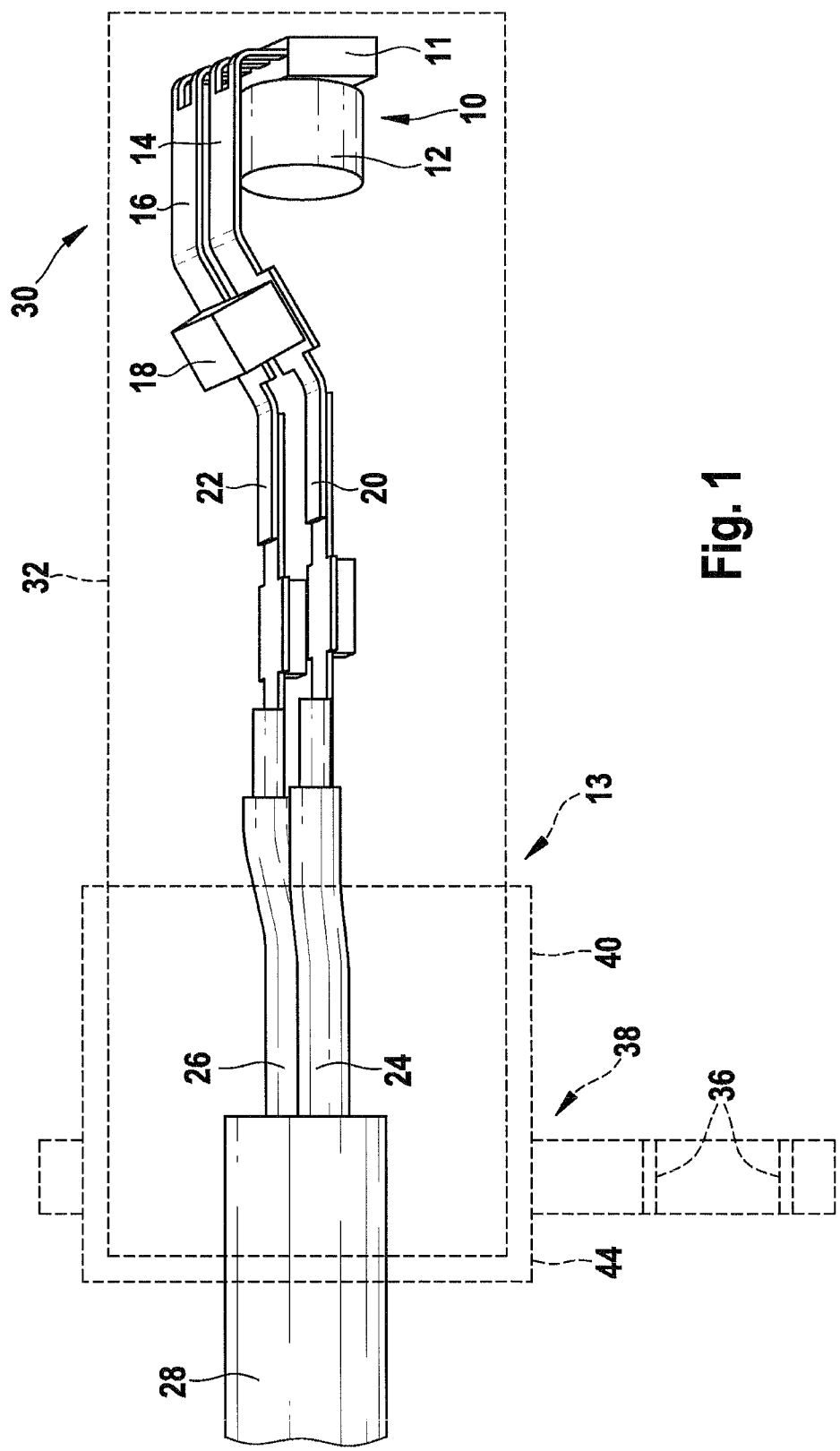
FIG. 1 shows a schematic depiction of a magnetic field sensor according to the present invention.

FIG. 1 shows electrical assembly 10 of a magnetic field sensor 13, which is to be encapsulated in thermoplastic according to the proposed method, magnetic field sensor 13 being designed as a rotational speed sensor for use to detect the wheel speed of a motor vehicle. It contains an IC component 11 which includes a sensor element and an integrated circuit for preparing the measurement signals and the measured value output. The magnetic field which is used to generate the measured signals is provided by a cylindrical permanent magnet 12 which is located directly adjacent to IC component 11. Two conductor tracks 14 and 16 of integrated circuit 11 are bridged by a capacitor 18 in order to reduce signal spikes, and are connected via crimp connections 20 and 22 to connecting lines 24 and 26 of a cable 28, the front end of which is encapsulated in plastic together with lines 24 and 26, capacitor 18, permanent magnet 12, and integrated circuit 11 to create the finished magnetic field sensor, the design and mode of operation of which is known. The individual parts that are encapsulated in plastic are indicated in FIG. 1 using dashed lines, and they are described in greater detail in the figures that follow.

Figure 2:
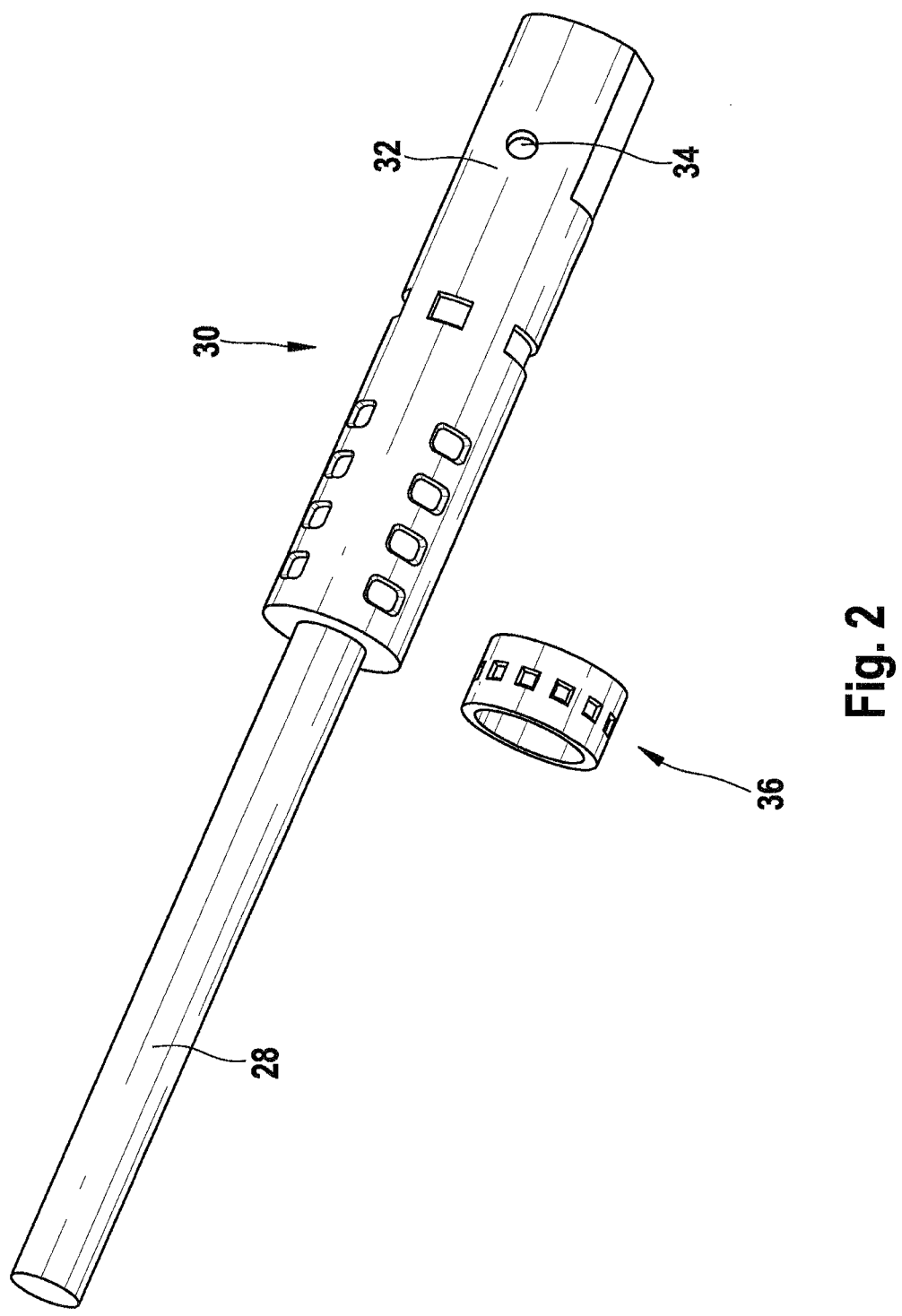
FIG. 2 shows a perspective view of a core-type insertion part that accommodates the electronic assembly, including a connecting cable, as a preassembled component of the magnetic field sensor.

FIG. 2 shows, in a perspective view, a core-type insertion part 30 that contains electrical assembly 10, which is connected to connecting cable 28, in a cylindrical injection-molded coating 32. A bore 34 marks the position of IC component 11 of electrical assembly 10 as the sensing element, based on which magnetic field sensor 13 is oriented during assembly. FIG. 2 also shows a metallic socket 36 in the position in which it is connected to insertion part 30 in the second injection step.

Figure 3:
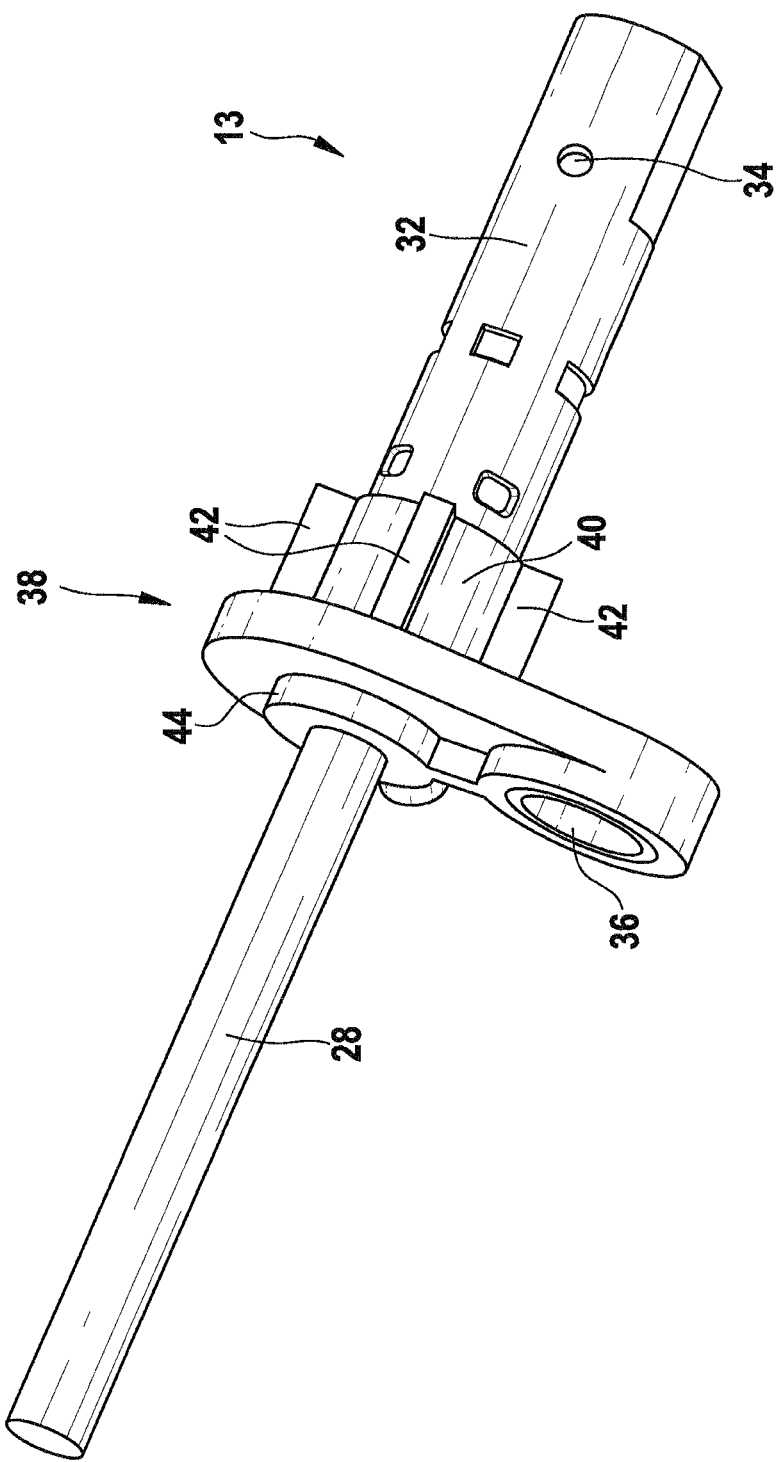
FIG. 3 shows a perspective view of a finished magnetic field sensor.

FIG. 3 shows, likewise in a perspective view, finished magnetic field sensor 30 after the second injection step, in which a fastening tab 38 was integrally extruded on core-type insertion part 30 in a specifiable longitudinal and angular position. In this second injection step, insertion part 30 is positioned via bore 34 in terms of the longitudinal and angular position in an injection mold, which is explained further below, and in which fastening tab 38 is then integrally extruded in the position that is specified for subsequent installation of sensor 13.

Metallic socket 36, which is shown in FIG. 2, is injected into fastening tab 38 in order to increase the stability of the sensor attachment. In addition, a centering sleeve 40, which partially overlaps plastic injection-molded coating 32 of insertion part 30, is integrally extruded onto the fastening tab; centering sleeve 40 includes four ribs 42 which are evenly distributed around the circumference of the centering sleeve, and which are used to center entire sensor 13 during installation. Furthermore, an annular flange 44 is also integrally extruded on fastening tab 38, opposite to centering sleeve 40; annular flange 44 encloses connecting cable 38 and stabilizes the transition from the cable to insertion part 30.

Figure 4:
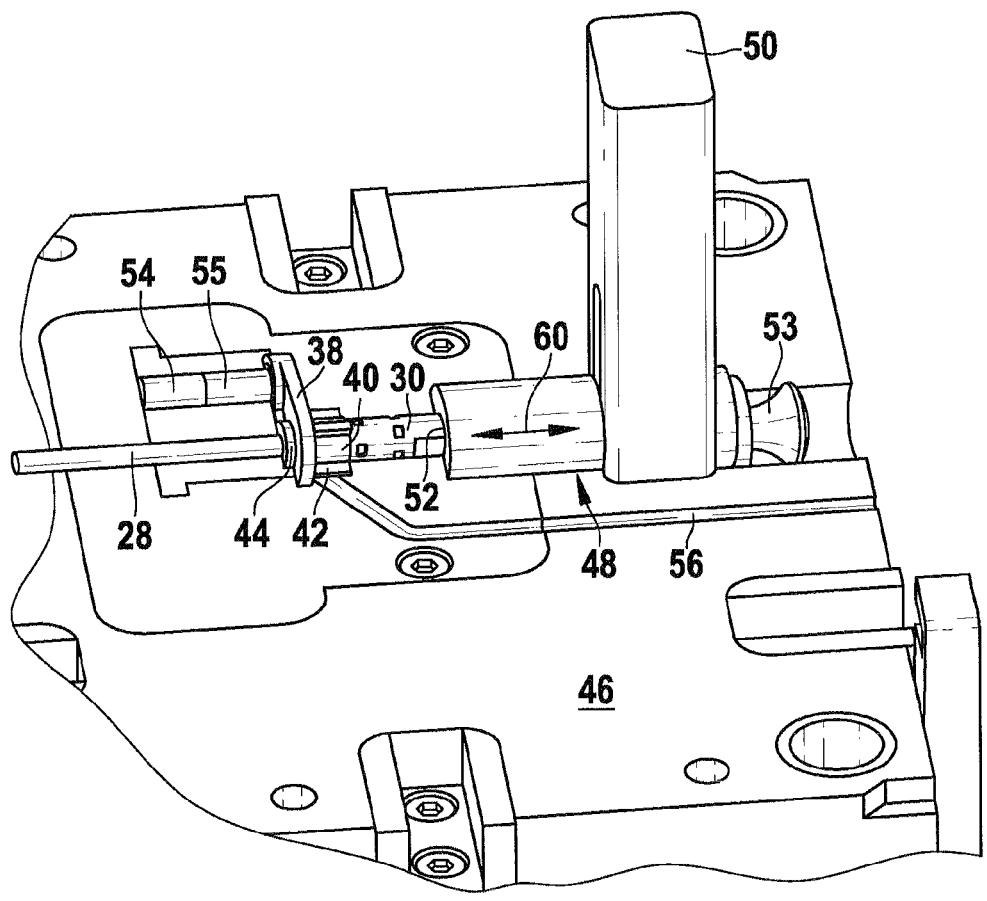
FIG. 4 shows a perspective view of the bottom part of an injection mold, into which the tool insert has been inserted and is used to receive the insertion part shown in FIG. 1.

FIG. 4 shows a perspective view of bottom part 46 of an injection mold, including tool insert 48 for receiving insertion part 30. Tool insert 48 is cylindrical in shape, and includes a cylindrical bore 52 for receiving cylindrical insertion part 30. The tool insert is situated in the injection mold and in a carrier 50 such that it is continually longitudinally displaceable and rotatable into any position, and may then be locked into the selected position, as will be explained in greater detail below with reference to FIG. 5 in particular. For adjustment purposes, a handle 53 is integrally formed thereon in this embodiment.

After carrier 50 has been positioned in bottom part 46 of the injection mold, insertion part 30, together with connecting cable 28, is positioned in injection mold 46 and in tool insert 48 in a functional length and angular position as required for subsequent installation, and the tool insert is locked in position in the injection mold. Socket 36, which will be injected into fastening tab 38, is slid via a sliding mechanism 54 and a mandrel 55 into its position, which is shown in FIGS. 2 and 3, in the region of fastening tab 38 which will be integrally extruded, and sliding mechanism 54 is subsequently retracted. The plastic mass to be used to integrally extrude fastening tab 38 is supplied via a channel 56.

FIG. 4 shows the injection mold, which has been opened after the injection step. The sensor is located in bottom part 46 of the injection mold. In this illustration, fastening tab 38 has already been integrally extruded onto insertion part 30, and so finished magnetic field sensor 13 may be ejected.

Figure 5:
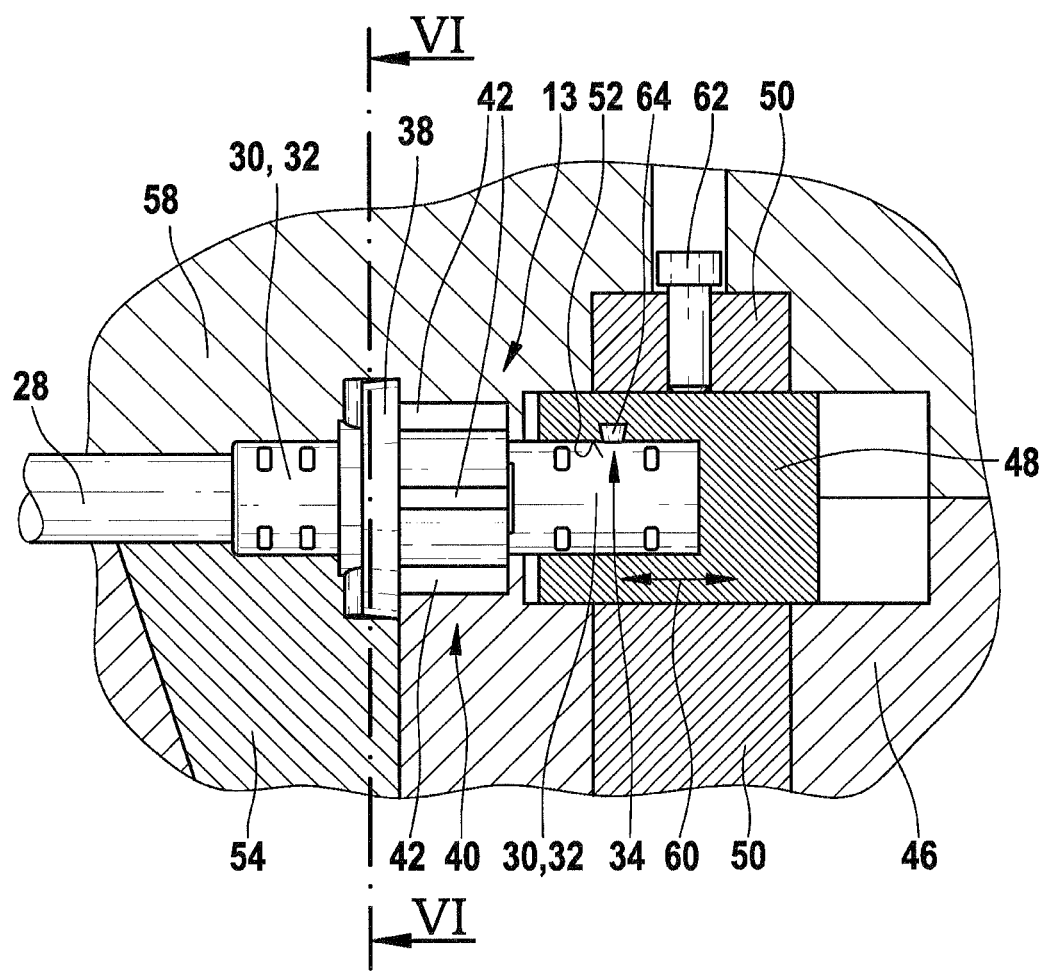
FIG. 5 shows a cross section through the injection mold, including an illustration of a finished magnetic field sensor.

FIG. 5 shows a cross section through the injection mold, including bottom part 46, sliding mechanism 54, which is designed as an angled slide, and a top part 58. Carrier 50, in which tool insert 48 is held in a manner such that it is longitudinally displaceable as indicated by arrow 60, and is rotatable about its central axis, is located via a portion of its extension in bottom part 46 and in top part 58. Tool insert 48 is fastened in carrier 50 using a locking part 62. Insertion part 30 is slid into bore 52 in tool insert 48 in its specified angular position until it reaches the end of bore 52. The insertion part is locked in position using a retaining pin 64 which secures the angular position that is defined upon insertion, and which holds the insertion part, including connecting cable 28, in its position; the retaining pin engages in marking bore 34 in insertion part 30 and secures the position which is defined by the position of IC component 11.

The different possibilities for positioning fastening tab 38 become clear by comparing FIGS. 3 and 5. In FIG. 3, fastening tab 38 is located on the cable-side end of insertion part 30, whereas, in the embodiment depicted in FIG. 5, it is located further in the middle of insertion part 30 and thereby determines another functional length of the sensor. The positioning is determined by the longitudinal displacement as indicated by arrow 60, and optionally via rotation of tool insert 48; insertion part 30 is inserted completely into bore 52 in both cases. The position of fastening tab 38 in the injection mold is fixedly specified.

Figure 6:
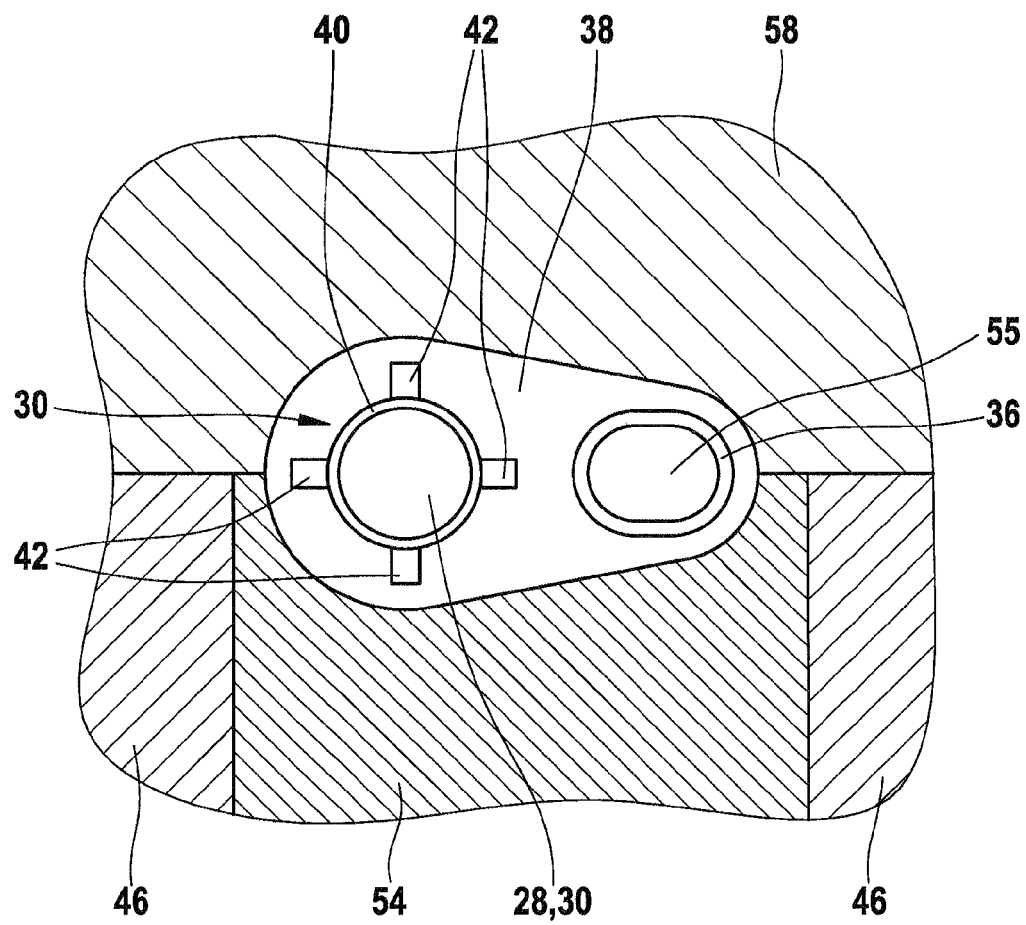
FIG. 6 shows a cross sectional along line VI-VI in FIG. 5.

FIG. 6 shows a cross section through the injection mold in the region of line of intersection VI-VI in FIG. 5. This illustration also shows the design of fastening tab 38 for insertion part 30, as well as the position of fastening socket 36 which is oval in this case, in order to obtain a certain amount of fastening tolerance upon installation of the sensor. For the rest, identical parts are labelled in FIG. 6 with the same reference numerals that are used in the preceding illustrations.

What is claimed is:

1. A method for producing a magnetic field sensor (13), in which an electrical assembly (10) and the end of a connecting cable (28) are encapsulated in plastic via injection molding, and a fastening tab (38) is integrally extruded,
   wherein, after a first injection step in which the electrical assembly (10) and the connecting cable (28) are encapsulated in a cylindrical, core-type first molded part (30, 32), then, in a second injection molding step, a fastening tab (38) is integrally formed via injection molding on the core-type insertion part (30) in a specifiable longitudinal and/or angular position, the core-type insertion part (30) being held in an injection mold (46, 58) in a longitudinally displaceable and/or rotatable manner.

2. The method as recited in claim 1, wherein in the second injection step, the core-type insertion part (30) is held in a tool insert (48) which is longitudinally displaceable and/or rotatable in the injection mold (46, 58).

3. The method as recited in claim 1, wherein the core-type insertion part (30) is substantially cylindrical in shape, and it is positioned in a bore (58) of the tool insert (48).

4. The method as recited in claim 1, wherein, in the second injection step, a preferably metallic socket (36) is injected into the fastening tab (38).

5. The method as recited in claim 1, wherein, in the second injection step, a centering sleeve (40) that encloses the core-type insertion part (30) is integrally formed as a single piece on the fastening tab (38) via injection molding.

6. The method as recited in claim 1, wherein the electrical assembly includes a permanent magnet 12.

7. The method of claim 1 wherein the magnetic field sensor (13) is a rotational speed sensor and/or direction of rotation sensor for the wheel rotation or for the drivetrain of a motor vehicle.

\* \* \* \* \*